(12) United States Patent
Kanemura et al.

(10) Patent No.: US 11,658,028 B2
(45) Date of Patent: *May 23, 2023

(54) FILM FORMING METHOD AND FILM FORMING APPARATUS

(71) Applicant: TOKYO ELECTRON LIMITED, Tokyo (JP)

(72) Inventors: Rui Kanemura, Nirasaki (JP); Hiroyuki Hayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 633 days.

This patent is subject to a terminal disclaimer.

(21) Appl. No.: 16/539,157

(22) Filed: Aug. 13, 2019

(65) Prior Publication Data

US 2020/0058499 A1  Feb. 20, 2020

(30) Foreign Application Priority Data

Aug. 17, 2018 (JP) .............................. JP2018-153701

(51) Int. Cl.
  *H01L 21/02* (2006.01)
  *H01L 21/3065* (2006.01)
  *H01L 21/67* (2006.01)
  *C23C 16/24* (2006.01)
  (Continued)

(52) U.S. Cl.
  CPC ........ *H01L 21/02532* (2013.01); *C23C 16/24* (2013.01); *C23C 16/52* (2013.01); *C23C 16/56* (2013.01); *H01L 21/0262* (2013.01); *H01L 21/02592* (2013.01); *H01L 21/02664* (2013.01);
  (Continued)

(58) Field of Classification Search
  CPC ......... H01L 21/02532; H01L 21/02592; H01L 21/0262; H01L 21/02664; H01L 21/3065; H01L 21/67069; C23C 16/24; C23C 16/52; C23C 16/56

See application file for complete search history.

(56) References Cited

U.S. PATENT DOCUMENTS 6,303,413 B1 * 10/2001 Kalnitsky ......... H01L 21/76264
                                                         438/296
11,101,131 B2 *  8/2021 Kanemura ........ H01L 21/32135
(Continued)

FOREIGN PATENT DOCUMENTS

JP    2001267530 A    9/2001
JP    2012138627 A    7/2012
(Continued)

*Primary Examiner* — Kelly M Gambetta
(74) *Attorney, Agent, or Firm* — Nath, Goldberg & Meyer; Jerald L. Meyer; Tanya E. Harkins

(57) ABSTRACT

A film forming method for forming a silicon film having a step coverage on a substrate having a recess in a surface of the substrate, the film forming method comprising: forming a silicon film such that a film thickness on an upper portion of a side wall of the recess is thicker than a film thickness on a lower portion of the side wall of the recess by supplying a silicon-containing gas to the substrate; and etching a portion of the silicon film conformally by supplying an etching gas to the substrate, wherein the act of forming the silicon film and the act of etching the portion of the silicon film are performed a number of times which is determined depending on the step coverage.

12 Claims, 5 Drawing Sheets

(51) Int. Cl.
*C23C 16/56* (2006.01)
*C23C 16/52* (2006.01)

(52) U.S. Cl.
CPC .... *H01L 21/3065* (2013.01); *H01L 21/67069* (2013.01)

(56) References Cited

U.S. PATENT DOCUMENTS

2003/0207580 A1* 11/2003 Li ................... H01L 21/02211
257/E21.252
2011/0263105 A1* 10/2011 Hasebe ................ C23C 16/24
977/890
2017/0178899 A1* 6/2017 Kabansky ............ H01J 37/321

FOREIGN PATENT DOCUMENTS

| JP | 2015-045082 A | 3/2015 |
| JP | 2017-162851 A | 9/2017 |
| KR | 1020070102960 A | 10/2007 |

\* cited by examiner

FILM FORMING METHOD AND FILM FORMING APPARATUS

CROSS-REFERENCE TO RELATED APPLICATION

This application is based upon and claims the benefit of priority from Japanese Patent Application No. 2018-153701, filed on Aug. 17, 2018, the entire contents of which are incorporated herein by reference.

TECHNICAL FIELD

The present disclosure relates to a film forming method and a film forming apparatus.

BACKGROUND

There is a demand to form a silicon film having a poor step coverage with respect to a recess. In addition, it is known that when a silicon film is formed in the recess using disilane gas, the step coverage in the recess is degraded (for example, Patent Document 2).

RELATED ART DOCUMENTS

Patent Document 1: Japanese Patent Application Publication No. 2001-267530
Patent Document 2: Japanese Patent Application Publication No. 2012-138627

SUMMARY

A film forming method for forming a silicon film having a certain step coverage on a substrate having a recess in a surface of the substrate, the film forming method comprising: forming a silicon film such that a film thickness on an upper portion of a side wall of the recess is thicker than a film thickness on a lower portion of the side wall of the recess by supplying a silicon-containing gas to the substrate; and etching a portion of the silicon film conformally by supplying an etching gas to the substrate, wherein the act of forming the silicon film and the act of etching the portion of the silicon film are performed a number of times which is determined depending on the step coverage.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
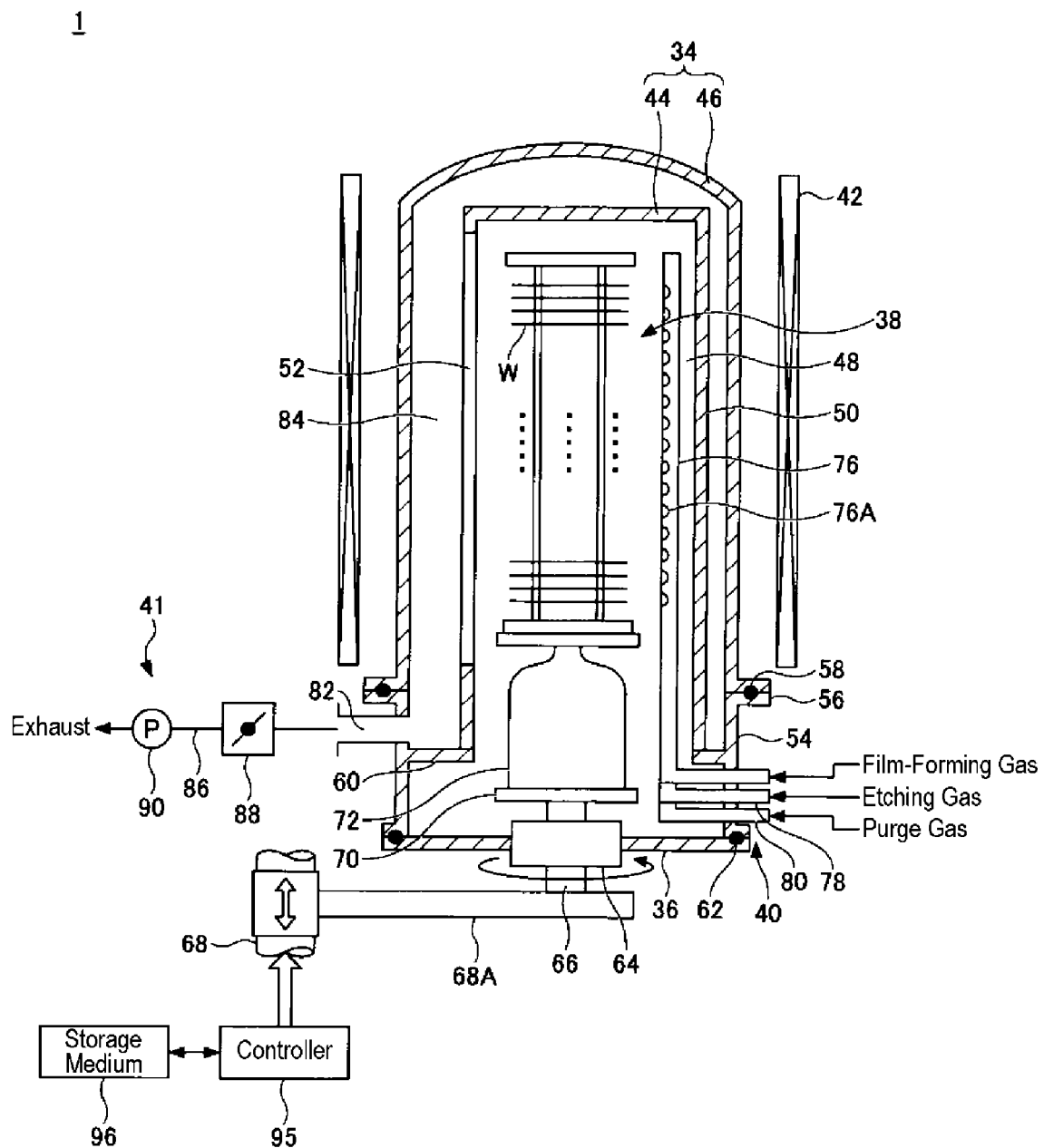
FIG. 1 is a schematic view illustrating a configuration of a film forming apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. In all the accompanying drawings, the same or corresponding members or components will be denoted by the same or corresponding reference numerals, and redundant descriptions will be omitted.

(Film Forming Apparatus)

With respect to a film forming apparatus for performing a film forming method according to an embodiment of the present disclosure, a batch-type vertical heat treatment apparatus, which collectively performs a heat treatment on a number of substrates, will be described as an example. However, the film forming apparatus is not limited to the vertical heat treatment apparatus, and may be various apparatuses. For example, the film forming apparatus may be a single-wafer-type apparatus that processes substrates one by one. In addition, the film forming apparatus may be, for example, a semi-batch-type apparatus, which causes a plurality of substrates disposed on a rotary table in a processing container to sequentially pass through an area to which a source gas is supplied and an area to which a reaction gas reactive with the source gas is supplied by rotating the rotary table such that a film is formed on the surfaces of the substrates.

Figure 2:
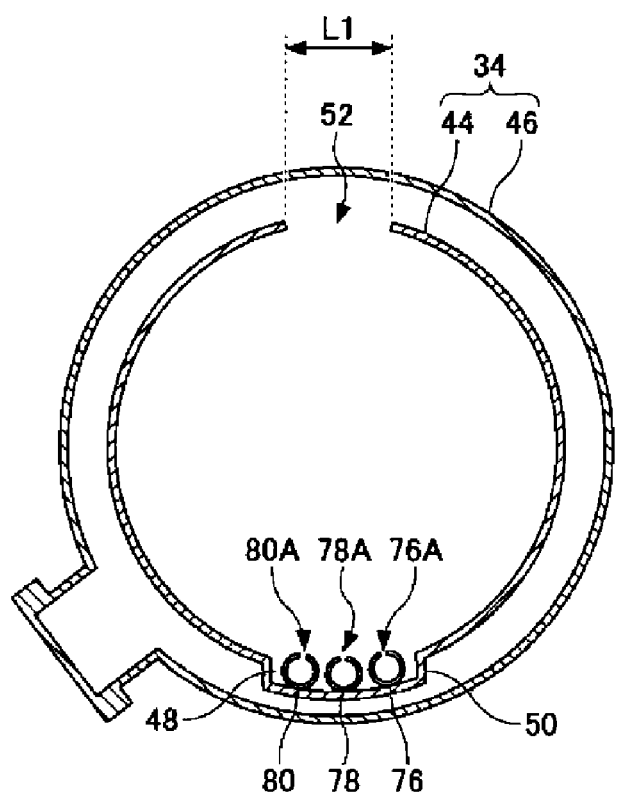
FIG. 2 is an explanatory view of the processing container of the film forming apparatus of FIG. 1.

FIG. 1 is a view illustrating a configuration of a film forming apparatus according to an embodiment. FIG. 2 is an explanatory view of the processing container of the film forming apparatus of FIG. 1.

As illustrated in FIG. 1, a film forming apparatus 1 has a processing container 34 configured to accommodate a semiconductor wafer (therein, referred to as a "wafer W"), which is a substrate.

The processing container 34 has a cylindrical inner tube 44 having a bottom that is opened and a ceiling, and a cylindrical outer tube 46 having a bottom that is opened and a ceiling and covering the outer side of the inner tube 44. The inner tube 44 and the outer tube 46 are formed of a heat-resistant material such as quartz, and are arranged coaxially to form a double-tube structure.

The ceiling of the inner tube 44 is, for example, flat. On one side of the inner tube 44, a nozzle accommodation part 48 configured to accommodate a gas supply pipe is provided in the longitudinal direction (vertical direction) thereof. For example, as illustrated in FIG. 2, a portion of the side wall of the inner tube 44 protrudes outward so as to form a convex portion 50, and the inside of the convex portion 50 is formed as the nozzle accommodation part 48. In the side wall of the inner tube 44 opposite the nozzle accommodation part 48, an opening 52 having a rectangular shape and a width L1 is provided in the longitudinal direction (vertical direction).

The opening 52 is a gas exhaust port formed so as to exhaust the gas in the inner tube 44. The length of the opening 52 is equal to or longer than the length of a wafer boat 38, and is formed to extend in the vertical direction. That is, the upper end of the opening 52 extends to be located at a height equal to or higher than the position corresponding to the upper end of the wafer boat 38, and the lower end of the opening 52 extends to be located at a height equal to or lower than the position corresponding to the lower end of the wafer boat 38.

The lower end of the processing container 34 is supported by a manifold 54 which has a cylindrical shape and is formed of, for example, stainless steel. A flange 56 is formed at the upper end of the manifold 54, and the lower end of the outer tube 46 is installed and supported on the flange 56. A seal member 58 such as an O-ring is interposed between the flange 56 and the lower end of the outer tube 46 so as to maintain the inside of the outer tube 46 in a hermetically sealed state.

A circular annular support 60 is provided on the inner wall of the upper portion of the manifold 54, and the lower end of the inner tube 44 is installed and supported on the support 60. A lid 36 is hermetically installed to the opening at the lower end of the manifold 54 via a sealing member 62 such as an O-ring so as to hermetically close the opening at the lower end of the processing container 34, that is, the opening of the manifold 54. The lid 36 is formed of, for example, stainless steel.

A rotary shaft 66 is penetrated through the center of the lid 36 via a magnetic fluid seal 64. The lower portion of the rotary shaft 66 is rotatably supported by an arm 68A of an elevating part 68 including a boat elevator.

A rotary plate 70 is provided at the upper end of the rotary shaft 66, and the wafer boat 38 that holds wafers W is loaded on the rotary plate 70 via a heat-insulating base 72 made of quartz. Therefore, by moving the elevating part 68 up and down, the lid 36 and the wafer boat 38 move vertically as a unit, so that the wafer boat 38 is inserted into and removed from the processing container 34. The wafer boat 38 is a substrate holder that holds a number of wafers W at predetermined intervals.

A gas supply 40 is provided in the manifold 54, and introduces gases such as a film forming gas, an etching gas, and a purge gas into the inner tube 44. The gas supply 40 has a plurality of (e.g., three) gas supply pipes 76, 78, and 80 made of quartz. Each of the gas supply pipes 76, 78, and 80 is provided within the inner tube 44 in the longitudinal direction, and the base end thereof is bent in an L shape and penetrates the manifold 54 so as to be supported.

As illustrated in FIG. 2, the gas supply pipes 76, 78, and 80 are installed in the nozzle accommodation part 48 of the inner tube 44 in a row in the circumferential direction. A plurality of gas holes 76A, 78A, and 80A are formed in each of the gas pipes 76, 78, and 80 at predetermined intervals in the longitudinal direction thereof, so that a gas may be ejected horizontally from each of the plurality of gas holes 76A, 78A, and 80A. The predetermined intervals are set, for example, to be equal to the intervals of the wafers W supported by the wafer boat 38. The positions in the height direction are set such that each of the gas holes 76A, 78A, and 80A is located in the middle between vertically adjacent wafers W, so that each gas may be efficiently supplied to spaces between the wafers W. In an embodiment, the gas supply pipe 76 constitutes a film forming gas supply that supplies a film forming gas, the gas supply pipe 78 constitutes an etching gas supply that supplies an etching gas, and the gas supply pipe 80 constitutes a purge gas supply that supplies a purge gas. The film forming gas, the etching gas, and the purge gas are controlled in flow rate, and are supplied into the processing container 34 as required.

A gas outlet 82 is formed on the side wall of the upper portion of the manifold 54 and above the support 60, and the gas in the inner tube 44, which is exhausted from the opening 52, may be exhausted through a space portion 84 between the inner tube 44 and the outer tube 46. The gas outlet 82 is provided with an exhaust part 41. The exhaust part 41 has an exhaust passage 86 connected to the gas outlet 82. A pressure regulating valve 88 and a vacuum pump 90 are sequentially provided in the exhaust passage 86, so that it is possible to evacuate the inside of the processing container 34.

On the outer circumferential side of the outer tube 46, a heater 42 is provided so as to cover the outer tube 46. The heater 42 heats the wafers W accommodated in the processing container 34.

The operation of each part of the film forming apparatus 1 is controlled by a controller 95 such as a computer. A computer program that performs the operation of each part of the film forming apparatus 1 is stored in a storage medium 96. The storage medium 96 may be, for example, a flexible disk, a compact disk, a hard disk, a flash memory, or a DVD.

(Film Forming Method)

Figure 3:
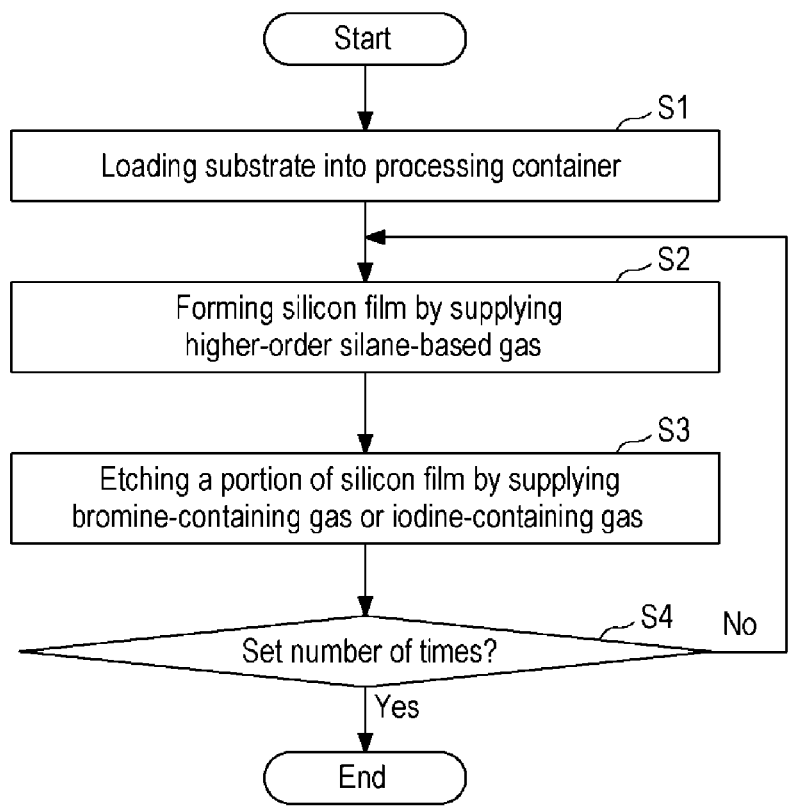
FIG. 3 is a flowchart illustrating a film forming method according to an embodiment.
Figure 4:
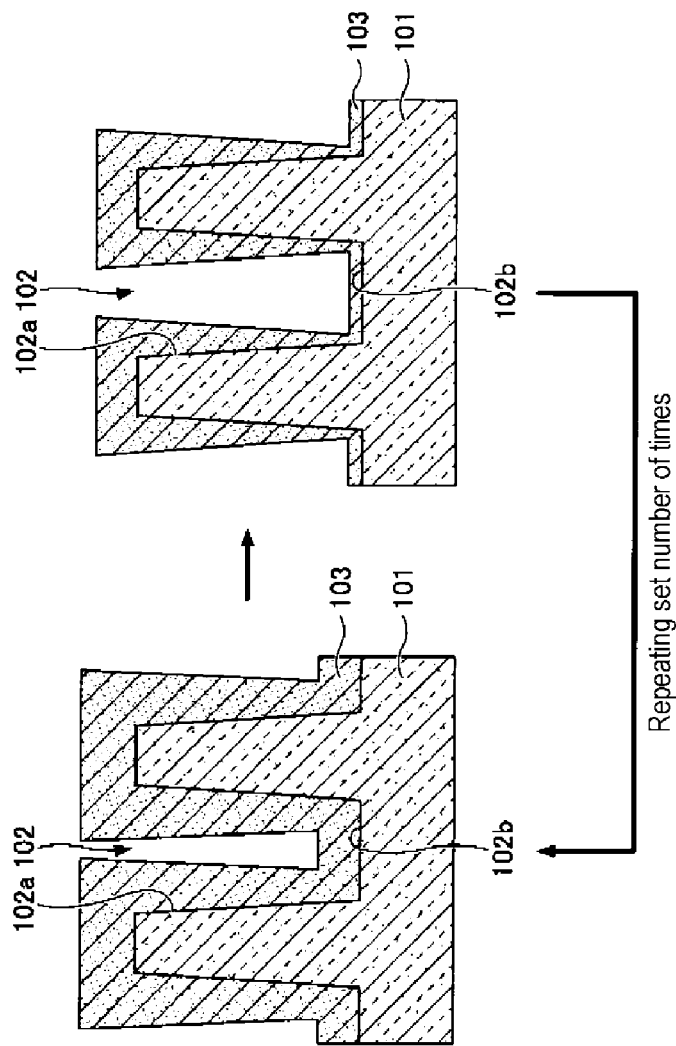
FIGS. 4A to 4C are cross-sectional process views illustrating a film forming method according to an embodiment.

With respect to a film forming method according to an embodiment of the present disclosure, a case in which an amorphous silicon film (hereinafter, referred to as a "silicon film") having a desired step coverage is formed on a substrate having a recess in the surface thereof by the film forming apparatus 1 will be described by way of an example. The following film forming method is executed by controlling each part of the film forming apparatus 1 by the controller 95. FIG. 3 is a flowchart illustrating a film forming method according to an embodiment. FIGS. 4A to 4C are cross-sectional process views illustrating a film forming method according to an embodiment.

First, as illustrated in FIG. 4A, a substrate 101 having a recess 102 formed on the surface thereof is provided. The substrate 101 may be, for example, a semiconductor wafer such as a silicon wafer. The recess 102 may be, for example, a trench or a hole.

Subsequently, the substrate 101 is loaded into the processing container 34 (loading step S1). In an embodiment, first, the wafer boat 38 holding a number of substrates 101 is loaded into the processing container 34 by the elevating part 68, and the opening at the lower end of the processing container 34 is hermetically closed and sealed by the lid 36. Subsequently, the inside of the processing container 34 is evacuated by the exhaust part 41 such that the pressure inside the processing container 34 becomes a predetermined pressure, and the heater 42 heats the substrate 101.

Subsequently, a silicon-containing gas is supplied from the gas supply pipe 76 into the processing container 34, and as illustrated in FIG. 4B, a silicon film 103 is formed such that the film thickness on the upper portions of the side walls of the recess 102 is thicker than that on the lower portions of the side walls 102a of the recess 102 (film forming step S2). In an embodiment, the film forming step S2 is performed while rotating the wafer boat 38. In the film forming step S2, the silicon film 103 is formed under process conditions (such as gas type, temperature, pressure, and the like) that enable desired in-plane uniformity to be obtained. In the film forming step S2, it is preferable to form the silicon film 103 such that the recess 102 is not clogged. Thereby, when etching step S3 described later is performed, the etching gas easily enters the inside of the recess 102, so that it is easy to achieve conformal etching. The silicon-containing gas may be any gas that is capable of forming the silicon film 103 such that the film thickness on the upper portions of the side walls 102a of the recess 102 is thicker than the film thickness on the lower portions of the side walls 102a of the recess 102. For example, the silicon-containing gas may be a higher-order silane-based gas including two silicon (Si) atoms in the molecular formula. Examples of the higher-order silane-based gas include disilane ($Si_2H_6$) gas, trisilane ($Si_3H_8$) gas, and tetrasilane ($Si_4H_{10}$) gas. The substrate temperature in film forming step S2 may be, for example, from 300 degrees C. to 530 degrees C.

Subsequently, the etching gas is supplied from the gas supply pipe 78 into the processing container 34, so that a portion of the silicon film 103 is conformally etched as illustrated in FIG. 4C (etching step S3). Thus, the silicon film 103 is etched while maintaining the state in which the film thickness on the upper portions of the side walls 102a of the recess 102 is thicker than that on the lower portions of the side walls 102a of the recess 102. Therefore, the silicon film 103 having step coverage of less than 100% is formed in the recess 102. The step coverage means the ratio (%) of the film thickness of the silicon film 103 on the lower portions of the side walls 102a to the thickness of the silicon film 103 on the upper portions of the side walls 102a. That is, when the film thickness of the silicon film 103 on the lower portions of the side walls 102a and the film thickness of the silicon film 103 on the upper portions of the side walls 102a are equal to each other, the step coverage is 100%. In addition, when the film thickness of the silicon film 103 on the lower portions of the side walls 102a is relatively thinner than the film thickness of the silicon film 103 on the upper portions of the side walls 102a, the step coverage is smaller than 100%. Meanwhile, when the film thickness of the silicon film 103 on the lower portions of the side walls 102a is relatively thicker than the film thickness of the silicon film 103 on the upper portions of the side walls 102a, the step coverage is larger than 100%. In an embodiment, the etching step S3 is performed while rotating the wafer boat 38. In the etching step S3, it is preferable to etch the silicon film 103 such that the side walls 102a and the bottom portion 102b of the recess 102 are not exposed. This makes it possible to prevent a base from being etched when the base is formed on the surface of the substrate 101. In particular, in the case in which the base is, for example, an insulating film, when the side walls 102a and the bottom portion 102b of the recess 102 are exposed, the roughness of the silicon film 103 formed in the next film forming step S2 may be deteriorated by the etching gas component adsorbed to a surface of the base. The etching gas may be any gas that is capable of conformally etching a portion of the silicon film 103, and may be, for example, a bromine-containing gas or an iodine-containing gas. Examples of the bromine-containing gas include hydrogen bromide (HBr) gas and bromine ($Br_2$) gas. Examples of the iodine-containing gas include hydrogen iodide (HI) gas and iodine ($I_2$) gas. The substrate temperature in the etching step S3 may be, for example, from 500 degrees C. to 650 degrees C.

Subsequently, it is determined whether the number of repetitions of the film forming step S2 and the etching step S3 reaches the set number of times (determination step S4). The set number of times is determined based on, for example, a desired step coverage, and data indicating the relationship between a predetermined step coverage and the number of repetitions of the film forming step S2 and the etching step S3. The data indicating the relationship between the step coverage and the number of repetitions of the film forming step S2 and the etching step S3 may be, for example, graphs or equations prepared in a preliminary test or the like for each of the conditions of the film forming step S2 and the etching step S3, and the film type or the film thickness of the film to be formed. In addition, in order to obtain a desired step coverage, in addition to determining the set number of times, the processing conditions may be finely adjusted in at least any one of the film forming step S2 and the etching step S3, which are performed multiple times. Specifically, the processing conditions may be finely adjusted, for example, in at least one of the film forming step S2 and the etching step S3, for example, at the last of the multiple times. The processing conditions may include, for example, a gas supply amount, a processing time, a processing pressure or the like.

In the determination step S4, when the set number of times is not reached, the process returns to the film forming step S2, and the film forming step S2 and the etching step S3 are repeated. By repeating the film forming step S2 and the etching step S3 until the set number of times is reached, it is possible to form the silicon film 103 having a desired step coverage with respect to the recess 102. Meanwhile, when the set number of times is reached in the determination step S4, the process is terminated.

In the above-described example, the case in which the film forming step S2 and the etching step S3 are repeated until the set number of times is reached and the process is terminated, in other words, the case in which the final step is the etching step S3 has been described, but the final step may be the film forming step S2. That is, after the film forming step S2 and the etching step S3 are repeated until the set number of times is reached, the film forming step S2 is performed and the process is terminated.

In the film formation of a silicon film using a higher-order silane-based gas such as disilane gas, it is possible to reduce the step coverage with respect to the recess, for example, by increasing the film forming temperature or increasing the pressure. However, when the film forming temperature is increased or the pressure is increased, the in-plane uniformity of the film thickness may be deteriorated. Therefore, conventionally, it has been difficult to form a silicon film having a desired step coverage with respect to the recess while maintaining the in-plane uniformity of the film thickness.

In an embodiment, the film forming step S2 of forming the silicon film 103 such that the film thickness on the upper portions of the side walls 102a of the recess 102 is thicker than that on the lower portions of the side walls 102a of the recess 102 and the etching step S3 of conformally etching a portion of the silicon film 103 are performed a number of times, which is determined depending on the desired step coverage. As a result, it is possible to form the silicon film 103 having a desired step coverage with respect to the recess 102 by performing the film formation and etching of the silicon film 103 under the process conditions, which enable good in-plane uniformity to be obtained, and controlling the number of repetitions of the film forming step S2 and the etching step S3.

(Evaluation)

The number of repetitions of the film forming step S2 and the etching step S3 was set to 0 times, 1 time, and 2 times by the film forming method according to the above-described embodiment, and amorphous silicon films were formed on substrates each having a recess on the surface thereof. Then, for each case, the step coverage of the silicon film with respect to the corresponding recess was measured. The wording "the number of repetitions is 0" means that the loading step S1 and the film forming step S2 are performed but the etching step S3 is not performed.

Figure 5:
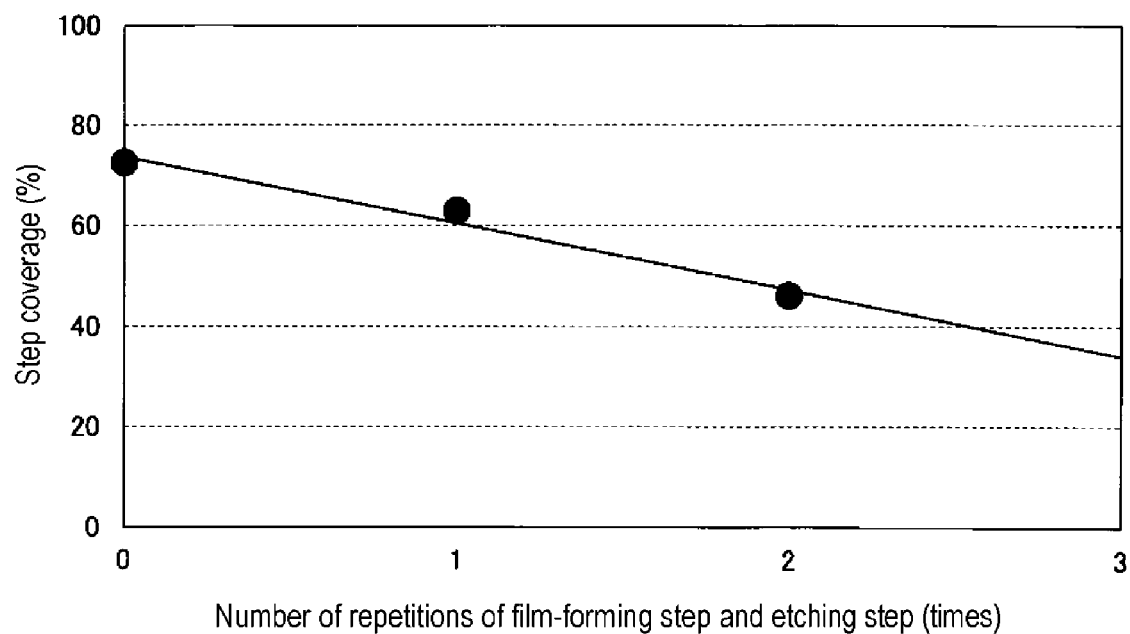
FIG. 5 is a graph representing a relationship between the number of repetitions and step coverage according to an embodiment.

FIG. 5 is a graph representing a relationship between the number of repetitions and step coverage according to an embodiment. In FIG. 5, the vertical axis represents the step coverage (%), and the horizontal axis represents the number of repetitions of the film forming step S2 and the etching step S3.

As represented in FIG. 5, the step coverages when the number of repetitions were 0, 1, and 2 were 72.5%, 62.9%, and 46.1%, respectively. From this point, it can be seen that it is possible to control the step coverage by adjusting the number of repetitions. For example, when the desired step coverage is 50%, in other words, when it is desired to form an amorphous silicon film having a 50% step coverage, the number of repetitions may be adjusted to two, which is the number of times at which the step coverage is closest to 50%.

According to the present disclosure, it is possible to form a silicon film having a desired step coverage with respect to a recess.

In the above-described embodiments, the case in which the substrate is a wafer has been described as an example, but the present disclosure is not limited thereto. For example, the substrate may be a large substrate for a flat panel display (FPD), or a substrate for an EL element or a solar cell.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method for forming a silicon film on a substrate having a recess in a surface of the substrate, the film forming method comprising:
    performing a cycle a set number of times, the cycle including:
        forming the silicon film such that a second film thickness is thicker than a first film thickness by supplying a silicon-containing gas to the substrate, wherein the first film thickness is a thickness of the silicon film at a lower portion of a side wall of the recess and the second film thickness is a thickness of the silicon film at an upper portion of the side wall of the recess; and
        etching a portion of the silicon film conformally such that a state in which the second film thickness is thicker than the first film thickness is maintained, by supplying an etching gas to the substrate,
    wherein the set number of times is set based on a target step coverage which is a target ratio of the first film thickness to the second film thickness.

2. The film forming method of claim 1, wherein the act of forming the silicon film comprises forming the silicon film such that the recess is not clogged.

3. The film forming method of claim 1, wherein the act of etching the portion of the silicon film comprises etching the silicon film such that the side wall and a bottom of the recess are not exposed.

4. The film forming method of claim 1, wherein the silicon-containing gas is a higher-order silane-based gas including two or more silicon atoms in a molecular formula of the higher-order silane-based gas.

5. The film forming method of claim 4, wherein the higher-order silane-based gas is a disilane gas.

6. The film forming method of claim 1, wherein the etching gas is a bromine-containing gas or an iodine-containing gas.

7. The film forming method of claim 6, wherein the bromine-containing gas is a hydrogen bromide gas or a bromine gas, and
    the iodine-containing gas is a hydrogen iodide gas or an iodine gas.

8. The film forming method of claim 1, wherein the recess is a trench or a hole.

9. The film forming method of claim 1, wherein after the act of forming the silicon film and the act of etching the portion of the silicon film are performed the set number of times, the act of forming the silicon film is again performed.

10. The film forming method of claim 1, further comprising, in at least one of the set number of cycles, adjusting process conditions of at least one of the act of forming the silicon film and the act of etching the portion of the silicon film.

11. The film forming method of claim 1, further comprising, in the last one of the set number of cycles, adjusting process conditions of at least one of the act of forming the silicon film and the act of etching the portion of the silicon film.

12. A film forming apparatus for forming a silicon film on a substrate having a recess in a surface of the substrate, the film forming apparatus comprising:
    a processing container in which the substrate is accommodated;
    a film forming gas supply configured to supply a silicon-containing gas into the processing container;
    an etching gas supply configured to supply an etching gas into the processing container; and
    a controller,
    wherein the controller is configured to control the film forming gas supply and the etching gas supply so as to execute:
    performing a cycle a set number of times, the cycle including:
        forming the silicon film such that a second film thickness is thicker than a first film thickness by supplying the silicon-containing gas to the substrate, wherein the first film thickness is a thickness of the silicon film at a lower portion of a side wall of the recess and the second film thickness is a thickness of the silicon film at an upper portion of the side wall of the recess; and
        etching a portion of the silicon film conformally such that a state in which the second film thickness is thicker than the first film thickness is maintained, by supplying the etching gas to the substrate,
    wherein the set number of times is set based on a target step coverage which is a target ratio of the first film thickness to the second film thickness.

* * * * *